United States Patent
Jiang et al.

(10) Patent No.: US 11,336,118 B2
(45) Date of Patent: May 17, 2022

(54) Q-FACTOR DETERMINATION IN WIRELESS CHARGING SYSTEM HAVING COMPLEX RESONANT CIRCUIT

(71) Applicant: NXP USA, INC., Austin, TX (US)

(72) Inventors: Dengyu Jiang, Suzhou (CN); Dechang Wang, Suzhou (CN); Li Wang, Suzhou (CN); Huan Mao, Suzhou (CN)

(73) Assignee: NXP USA, Inc., Austin, TX (US)

( * ) Notice: Subject to any disclaimer, the term of this patent is extended or adjusted under 35 U.S.C. 154(b) by 472 days.

(21) Appl. No.: 16/244,066

(22) Filed: Jan. 9, 2019

(65) Prior Publication Data
US 2020/0212713 A1    Jul. 2, 2020

(30) Foreign Application Priority Data
Dec. 26, 2018 (CN) .......................... 201811606827.1

(51) Int. Cl.
| | |
|---|---|
| *H02J 50/12* | (2016.01) |
| *H02J 7/02* | (2016.01) |
| *G01R 27/26* | (2006.01) |
| *H02J 50/60* | (2016.01) |
| *H02M 7/44* | (2006.01) |

(52) U.S. Cl.
CPC .......... *H02J 50/12* (2016.02); *G01R 27/2688* (2013.01); *H02J 7/025* (2013.01); *H02J 50/60* (2016.02); *H02M 7/44* (2013.01)

(58) Field of Classification Search
CPC . Y02E 60/12; H02J 7/025; H02J 5/005; H02J 17/00; H02J 50/12; H02J 50/60; H01F 38/14; Y02T 90/122; B60L 11/182; G01R 27/2688; H02M 7/44
USPC .......................................... 320/108; 307/104
See application file for complete search history.

(56) References Cited

U.S. PATENT DOCUMENTS

| | | | |
|---|---|---|---|
| 5,420,518 | A | 5/1995 | Schafer |
| 6,471,106 | B1 | 10/2002 | Reining |
| 8,983,374 | B2 | 3/2015 | Wiley |
| 9,178,387 | B2 | 11/2015 | Mohammadian et al. |

(Continued)

FOREIGN PATENT DOCUMENTS

| | | |
|---|---|---|
| CN | 103852631 A | 6/2014 |
| CN | 205027804 U | 2/2016 |

(Continued)

OTHER PUBLICATIONS

Notice of Allowance; U.S. Appl. No. 15/196,057; 9 pages (dated Apr. 6, 2018).

(Continued)

*Primary Examiner* — Richard Isla
*Assistant Examiner* — Mohammed J Sharief

(57) ABSTRACT

A wireless charger includes a rectifier, a first filter that includes an inductor, a resonant tank circuit, and a second filter that includes a switch. The rectifier receives a drive signal from a voltage supply and generates a rectified voltage signal. The rectified voltage signal is filtered by the first filter and the filtered signal is provided to the tank circuit, which resonates to provide power wirelessly to a receiver. The switch of the second filter is connected in parallel with the inductor of the first filter. The switch is closed in order to bypass the inductor during a detection phase in which the wireless charger determines a quality factor of the tank circuit.

21 Claims, 2 Drawing Sheets

(56) References Cited

U.S. PATENT DOCUMENTS

| | | | |
|---|---|---|---|
| 9,294,153 B2 | 3/2016 | Muratov et al. | |
| 9,316,674 B2 | 4/2016 | Baldischweiler et al. | |
| 9,319,157 B2 | 4/2016 | Alexander et al. | |
| 9,450,648 B2 | 9/2016 | Bastami | |
| 9,465,064 B2 | 10/2016 | Roy et al. | |
| 9,474,031 B1 | 10/2016 | Sedzin et al. | |
| 9,530,558 B2 | 12/2016 | Nakano et al. | |
| 9,722,446 B2 | 8/2017 | Kwon et al. | |
| 9,806,542 B2 | 10/2017 | Asanuma et al. | |
| 9,851,399 B2 | 12/2017 | Finkenzeller et al. | |
| 9,853,478 B2 | 12/2017 | Lee et al. | |
| 9,966,803 B2 | 5/2018 | Wang et al. | |
| 10,763,706 B2 | 9/2020 | Chen et al. | |
| 10,862,335 B2 | 12/2020 | Baarman et al. | |
| 2003/0141845 A1* | 7/2003 | Krieger | H02J 7/342 |
| | | | 320/132 |
| 2004/0189215 A1* | 9/2004 | Chen | H05B 41/2881 |
| | | | 315/224 |
| 2008/0197804 A1 | 8/2008 | Onishi et al. | |
| 2009/0021219 A1 | 1/2009 | Yoda et al. | |
| 2013/0069441 A1 | 3/2013 | Verghese | |
| 2013/0094598 A1 | 4/2013 | Bastami | |
| 2013/0154557 A1 | 6/2013 | Lee et al. | |
| 2013/0257165 A1 | 10/2013 | Singh | |
| 2013/0257168 A1 | 10/2013 | Singh | |
| 2014/0001879 A1 | 1/2014 | Van Wageningen | |
| 2014/0015329 A1 | 1/2014 | Widmer | |
| 2014/0015522 A1 | 1/2014 | Widmer et al. | |
| 2014/0049422 A1 | 2/2014 | Von Novak | |
| 2014/0084857 A1 | 3/2014 | Liu et al. | |
| 2014/0111019 A1 | 4/2014 | Roy | |
| 2014/0239735 A1 | 8/2014 | Abe et al. | |
| 2014/0247004 A1 | 9/2014 | Kari et al. | |
| 2014/0319924 A1 | 10/2014 | Jung | |
| 2014/0333145 A1 | 11/2014 | Lee et al. | |
| 2014/0361738 A1 | 12/2014 | Lee et al. | |
| 2015/0162779 A1 | 6/2015 | Lee et al. | |
| 2015/0198640 A1 | 7/2015 | Lee | |
| 2015/0318708 A1 | 11/2015 | Bartlett | |
| 2015/0318730 A1 | 11/2015 | Bhargava et al. | |
| 2015/0326031 A1* | 11/2015 | Yamaguchi | H02J 50/80 |
| | | | 307/104 |
| 2015/0372493 A1 | 12/2015 | Sankar | |
| 2016/0028248 A1 | 1/2016 | Asanuma et al. | |
| 2016/0146886 A1 | 5/2016 | Finkenzeller et al. | |
| 2016/0181871 A1* | 6/2016 | Krumme | H02J 50/10 |
| | | | 307/104 |
| 2016/0190852 A1 | 6/2016 | Chiang et al. | |
| 2016/0336809 A1 | 11/2016 | Gluzman et al. | |
| 2017/0271908 A1 | 9/2017 | Li et al. | |
| 2018/0048162 A1* | 2/2018 | Von Novak | H04B 5/0031 |
| 2018/0062504 A1 | 3/2018 | Mei et al. | |
| 2018/0115197 A1 | 4/2018 | Li et al. | |
| 2019/0272943 A1* | 9/2019 | Leem | H01F 27/2885 |
| 2020/0076246 A1* | 3/2020 | Fukuzawa | H02J 50/60 |
| 2020/0212713 A1 | 7/2020 | Jiang et al. | |

FOREIGN PATENT DOCUMENTS

| | | |
|---|---|---|
| DE | 2443069 | 3/1975 |
| TW | 200919901 A | 5/2009 |

OTHER PUBLICATIONS

Non Final Office Action; U.S. Appl. No. 15/355,075; 11 pages (dated Sep. 19, 2018).

Notice of Allowance; U.S. Appl. No. 15/355,075; 8 pages (dated Jan. 9, 2019).

U.S. Appl. No. 17/104,163; not yet published; 25 pages (dated Nov. 25, 2020).

* cited by examiner

Q-FACTOR DETERMINATION IN WIRELESS CHARGING SYSTEM HAVING COMPLEX RESONANT CIRCUIT

CROSS-REFERENCE TO RELATED APPLICATIONS

This application is related to U.S. Ser. No. 15/355,075 filed on Nov. 18, 2016 and U.S. Ser. No. 16/028,378 filed on Jul. 5, 2018, both of which are assigned to NXP USA, INC.

BACKGROUND

The present invention relates to wireless chargers and a method for detecting a quality factor (Q-factor) of a wireless charger, and, more particularly, to a wireless charger having a complex resonant tank circuit and a method for detecting the Q-factor of a wireless charger with a complex resonant tank circuit.

Quality factor (Q-factor) is used in wireless chargers to determine if an unfriendly foreign object (i.e., a metal object) is present in its charging area because the charger could heat up the metal, causing damage to the foreign object. Typically, the Q-factor is defined as a pole within a frequency band of interest. A signal with a sweeping frequency is applied to the resonant tank circuit of the charger to determine the Q-factor as the largest ratio of $V_{resonant}/V_{drive}$ over the sweeping frequency range, where $V_{resonant}$ is the signal voltage on a transmitter coil, and $V_{drive}$ is the signal voltage applied to the resonant tank circuit. While this method is readily performed on low power charging systems, which use a series LC resonant circuit, it cannot be easily performed in charging systems that use a more complex resonant circuit. For example, in automotive applications, complex resonant tank circuits are used to meet Electro Magnetic Compatibility (EMC) requirements. The more complex resonant circuits cause the system to have multiple poles, making it difficult to determine the Q-factor. Accordingly, it would be advantageous to have an apparatus for determining a Q-factor in a wireless charger having a complex resonant tank circuit.

SUMMARY

This summary is provided to introduce a selection of concepts in a simplified form that are further described below in the Detailed Description. This summary is not intended to identify key or essential features of the claimed subject matter, nor is it intended to be used to limit the scope of the claimed subject matter.

In one embodiment, the present invention provides a wireless charger including a rectifier, a filter that includes at least one inductor, a resonant tank circuit, and at least one switch. The rectifier receives a drive signal from a voltage supply and generates a rectified voltage signal. The filter is connected to the rectifier and receives the rectified voltage signal and generates a filtered signal. The tank circuit is connected to the filter and receives the filtered signal. The tank circuit provides wireless power to a receiver located within a charging area of the wireless charger. The at least one switch is connected in parallel with the at least one inductor. The at least one switch is closed during a Q-factor determination phase of the wireless charger.

In another embodiment, the present invention provides a method for detecting a quality factor in a wireless charger. The wireless charger includes a rectifier, a filter, and a resonant tank circuit. The rectifier receives a drive signal and generates a rectified signal. The filter, which includes at least one inductor, receives the rectified signal and generates a filtered signal. The resonant tank circuit is driven by the filtered signal. The method includes connecting at least one switch across the at least one inductor of the filter and then, in a detection phase of the wireless charger, closing the switch and detecting a quality factor, and in an operational phase, opening the switch.

BRIEF DESCRIPTION OF THE DRAWINGS

So that the manner in which the above recited features of the present invention can be understood in detail, a more detailed description of the invention may be had by reference to embodiments, some of which are illustrated in the appended drawings. The appended drawings illustrate only typical embodiments of the invention and should not limit the scope of the invention, as the invention may have other equally effective embodiments. The drawings are for facilitating an understanding of the invention and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
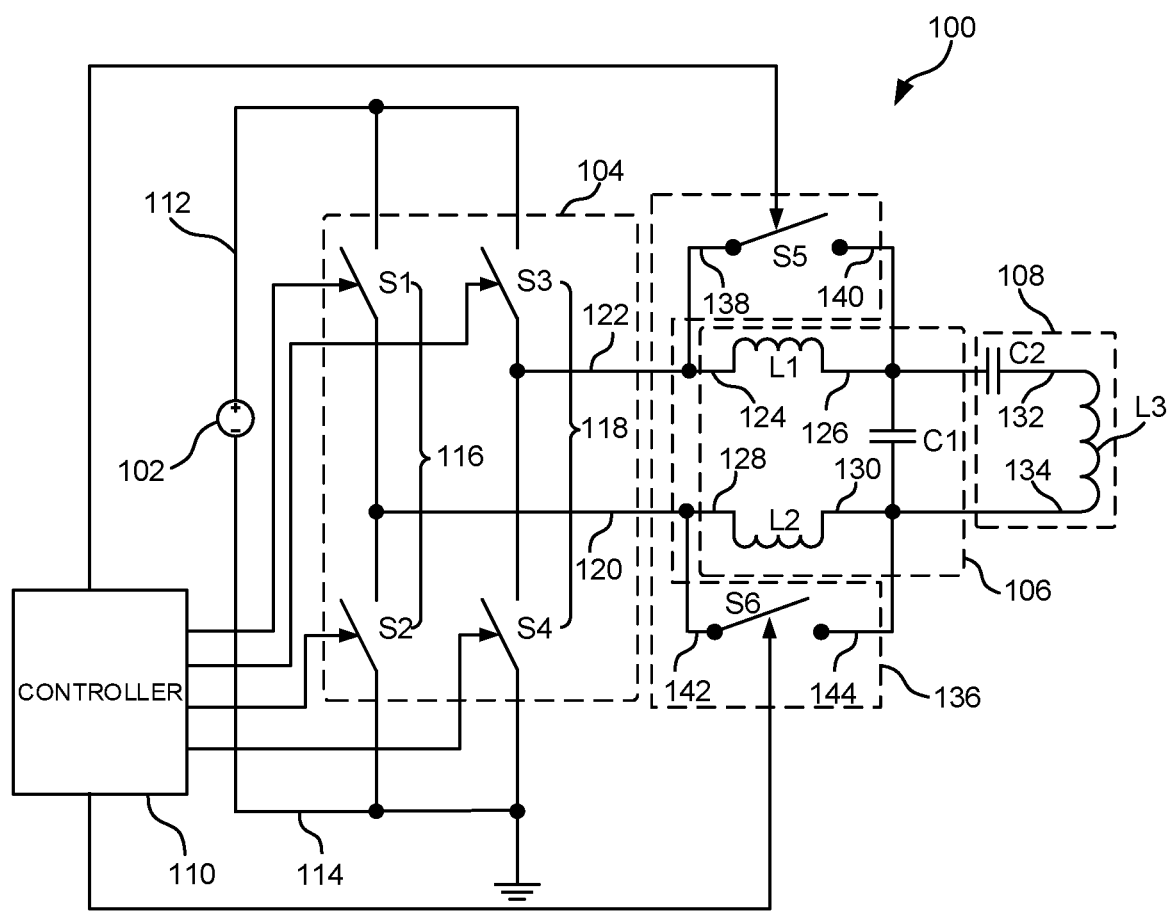
FIG. 1 is a schematic diagram of a wireless charger according to an exemplary embodiment of the present invention.

FIG. 1 is a circuit diagram of a wireless charger 100 according to an exemplary embodiment of the present invention. The wireless charger 100 includes a voltage supply 102, a rectifier 104, a filter 106, a resonant tank circuit 108 and a controller 110.

The voltage supply 102 generates a drive signal 112, which is used to drive the tank circuit 108. The rectifier 104 rectifies the drive signal 112 and generates rectified signals. In the presently preferred embodiment, the voltage supply 102 provides a DC voltage, and the rectifier 104 converts the DC voltage signal into AC signals and provides the AC signals to the resonant tank circuit 108.

In the presently preferred embodiment, the rectifier 104 is a full-bridge rectifier circuit and includes a first branch 116 and a second branch 118. The first and second branches 116 and 118 are connected in parallel between an output of the voltage supply 102 and ground 114. More particularly, the first branch 116 includes first and second series connected switches S1 and S2, where a first terminal of the first switch S1 receives the drive signal 112 and a terminal of the second switch S2 is connected to the ground 114. The second branch 118 includes third and fourth series connected switches S3 and S4, where a first terminal of the third switch S3 receives the drive signal 112 and a terminal of the fourth switch S4 is connected to the ground 114. The rectifier 104 has a first output terminal 120 and a second output terminal 122 that provide rectified signals to the filter 106. The first output terminal 120 is connected to a node between the first and second switches S1 and S2, and the second output terminal 122 is connected to a node between the third and fourth switches S3 and S4.

In operation, in the first branch 116, the first and second switches S1 and S2 are controlled by the controller 110 to be alternately closed. Similarly, in the second branch 118, the third and fourth switches S3 and S4 are controlled by the controller 110 to be alternately closed. The switches S1 and S2 or S3 and S4, are not closed simultaneously to avoid shorting the voltage supply 102.

The filter 106 is connected to the rectifier 104 to receive the rectified AC signals via the terminals 120 and 122. The filter 106 filters the rectified AC signals and generates filtered signals. In the current preferred embodiment, the filter 106 is a Pi-filter (π-filter), which includes first and second inductors L1 and L2, and a capacitor C1. The first inductor L1 is connected to the second output terminal 122 of the rectifier 104, and the second inductor L2 is connected to the first output terminal 120 of the rectifier 104.

The first inductor L1 has a first terminal 124 connected to the second output terminal 122 of the rectifier 104 and a second terminal 126 connected to the resonant tank circuit 108 and to a first terminal of the capacitor C1. Similarly, the second inductor L2 has a first terminal 128 connected to the first output terminal 120 of the rectifier 104 and a second terminal 130 connected to the resonant tank circuit 108 and to a second terminal of the capacitor C1. Thus, the capacitor C1 is connected between the second terminal 126 of the first inductor L1 and the second terminal 130 of the second inductor L2.

The Pi-filter 106 filters the rectified signals from the rectifier 104 to a desired condition and provides the filtered signals to the resonant tank circuit 108. In alternative embodiments, the filter 106 can include more or fewer inductors, and be implemented as an L-type filter or a T-type filter.

The resonant tank circuit 108 is connected to the filter 106 to receive the filtered signals. The resonant tank circuit 108 includes an inductor coil L3, which radiates power using the filtered signals. The radiated power may be used to charge a receiver device that is within the charging area of the wireless charger 100. The wireless charger 100 can also use the inductor coil L3 of the resonant tank circuit 108 to communicate with the receiver device, for example in the format of data packets according to the Qi standard. The inductor coil L3 of the resonant tank circuit 108 has a first terminal 132 coupled to the second terminal 126 of the first inductor L1 of the filter 106, and a second terminal 134 connected to the second terminal 130 of the second inductor L2 of the filter 106. The resonant tank circuit 108 also includes a capacitor C2 connected between the second terminal 126 of the first inductor L1 of the filter 106 and the first terminal 132 of the inductor coil L3.

As understood by those of skill in the art, Q-factor is one method of detecting the presence of a foreign object (FO) within the charging area of the wireless charger 100. Typically, the Q-factor is defined as a ratio of the energy stored in an oscillating resonator to the driving energy. For simplicity, the Q-factor of the resonant tank circuit 108 is calculated as Q=Vr/Vs, where Vr is the resonant voltage over the inductor coil L3 or the capacitor C2, and Vs is the supply voltage from the voltage supply 102. If an FO is present, the resonant voltage will fluctuate, and in turn the Q-factor will fluctuate. Fluctuation of the Q-factor is used to detect the presence of the FO.

It is understood that the Q-factor also reflects the power loss by the resonant tank circuit 108. In the wireless charger 100, there are multiple resonant elements, such as the first, second and third inductors L1, L2 and L3. Accordingly, the wireless charger 100 has multiple resonant frequencies, also referred to as "poles".

Figure 2:
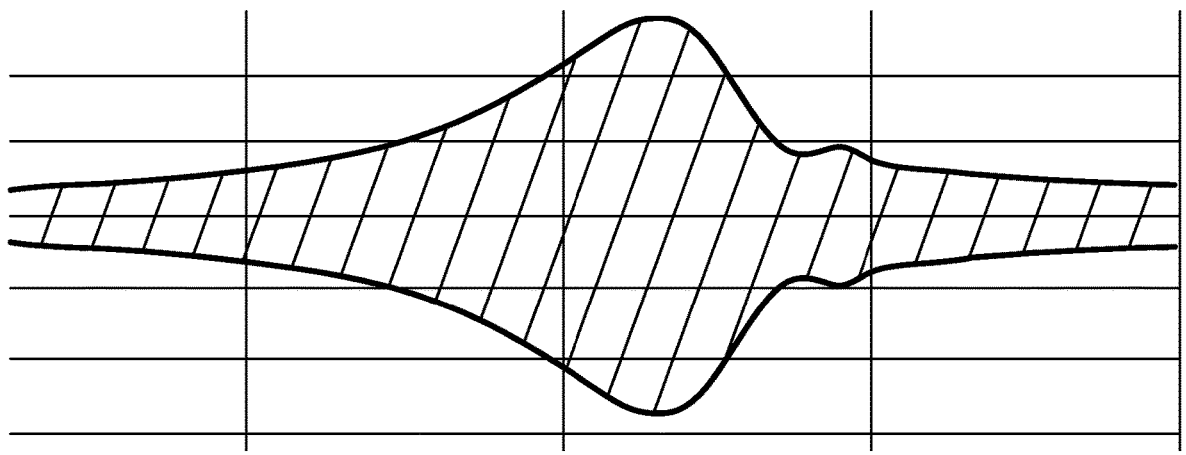
FIG. 2 is a sweeping frequency bode diagram of the wireless charger of FIG. 1 without a digital filter.

Referring to FIG. 2, a frequency sweeping bode diagram of the wireless charger 100 of FIG. 1 has multiple peaks in the frequency band of interest, representing multiple Q-factors and corresponding to multiple poles, which make it difficult to determine a Q-factor in order to detect the existence of an FO.

The wireless charger 100 further includes a second filter 136 connected across the inductors L1 and L2 of the filter 106. The second filter 136 is configured to remove additional poles of the resonant tank circuit 108 by shorting the inductors L1 and L2 during a detection phase in which the wireless charger 100 detects the quality factor.

Figure 3:
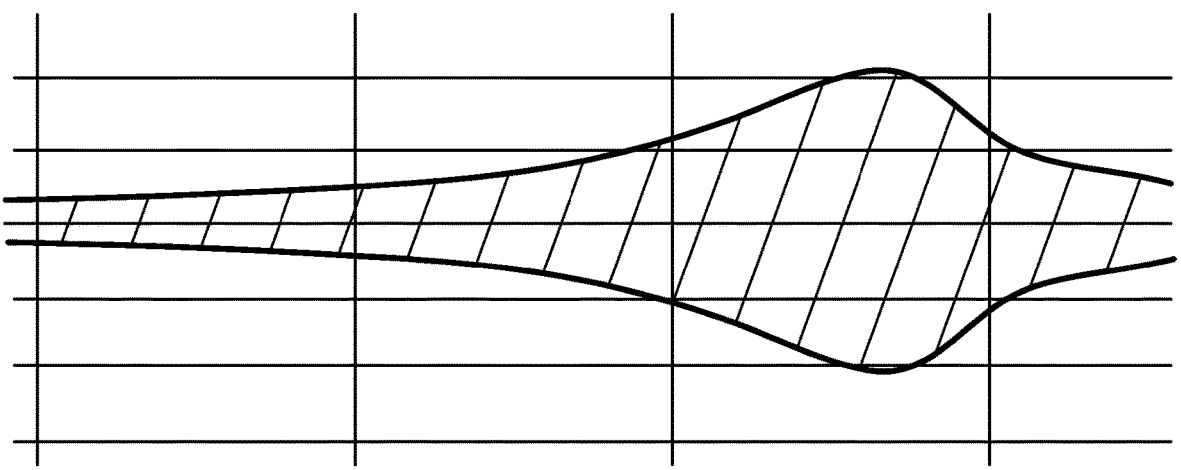
FIG. 3 is a sweeping frequency bode diagram of the wireless charger of FIG. 1 with a digital filter.

FIG. 3 is a frequency sweeping bode diagram of the wireless charger 100 when the second filter 142 is in operation, only one pole is shown, and the determination of the Q-factor is readily performed.

The second filter 136 includes a fifth switch S5 and a sixth switch S6 respectively connected across the first and second inductors L1 and L2 of the filter 106. More particularly, the fifth switch S5 has a first terminal 138 connected to the first terminal 124 of the first inductor L1 and the second output terminal 122 of the rectifier 104, and a second terminal 140 connected to the second terminal 126 of the first inductor L1. The sixth switch S6 has a first terminal 142 connected to the first terminal 128 of the second inductor L2 and the first output terminal 120 of the rectifier 104, and a second terminal 144 connected to the second terminal 130 of the second inductor L2 of the filter 106.

The controller 110 controls the first through sixth switches to place the wireless charger 100 in one of the Q-factor determination phase and a wireless charging phase. In operation, during the detection phase in which the wireless charger 100 determines the Q-factor, the fifth and sixth switches S5 and S6 are closed to bypass the first and second inductors L1 and L2, which reduces the number of resonant elements and removes the additional poles from the resonant signal.

The fifth and sixth switches S5 and S6 of the second filter 142 are controlled by the controller 110 and are closed during the detection phase and open during normal operation of the wireless charger 100. In one embodiment, the controller 110 closes one of the switch S2 in the first branch 116 or the switch S4 in the second branch 118 during the detection phase, to configure the rectifier 104 as a half-bridge rectifier. Because the switch S2 in the first branch 116 and the switch S4 in the second branch 118 are connected to ground, closing either of the switches S2 and S4 during the detection phase connects the first or second output terminal 120 or 122 of the rectifier 104 to ground. The switches in the other branch are alternately switched at the desired frequency to operate as a half-bridge rectifier.

The use of the terms "a" and "an" and "the" and similar referents in the context of describing the subject matter (particularly in the context of the following claims) are to be construed to cover both the singular and the plural, unless otherwise indicated herein or clearly contradicted by context. The terms "coupled" and "connected" both mean that there is an electrical connection between the elements being coupled or connected, and neither implies that there are no intervening elements. Recitation of ranges of values herein are intended merely to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A wireless charger, comprising:
a rectifier configured to receive a drive signal from a voltage supply and in response generate a rectified signal;
a filter coupled to the rectifier and configured to receive the rectified signal and in response generate a filtered signal, wherein the filter includes an inductor;
a resonant tank circuit coupled to the filter and configured to receive the filtered signal, wherein the resonant tank circuit is configured to provide wireless power to a receiver located within a charging area of the wireless charger; and
a switch coupled in parallel with the inductor, wherein the switch is configured to be closed during a Q-factor determination phase of the wireless charger.

2. The wireless charger of claim 1,
wherein the inductor has a first terminal coupled to the rectifier to receive the rectified signal and a second terminal configured to provide the filtered signal.

3. The wireless charger of claim 2,
wherein the switch has a first terminal coupled to the first terminal of the inductor and a second terminal coupled to the second terminal of the inductor.

4. The wireless charger of claim 1,
wherein the rectifier includes a first output terminal and a second output terminal configured to provide the rectified signal,
wherein the inductor is a first inductor;
wherein the filter includes a second inductor, and
wherein the first inductor is connected to the first output terminal and the second inductor is connected to the second output terminal.

5. The wireless charger of claim 4,
wherein the second inductor has a first terminal coupled to the second output terminal of the rectifier and is configured to receive the rectified signal, and a second terminal configured to provide the filtered signal.

6. The wireless charger of claim 5,
wherein the switch is a first switch;
further comprising a second switch coupled in parallel with the second inductor,
wherein the second switch is configured to be closed during the Q-factor determination phase, and
wherein the second switch includes a first terminal coupled to the first terminal of the second inductor and a second terminal coupled to the second terminal of the second inductor.

7. The wireless charger of claim 6,
wherein the filter includes a Pi-filter.

8. The wireless charger of claim 1,
wherein the rectifier is a full bridge rectifier circuit having a first branch including first and second series connected switches and a second branch including third and fourth series connected switches,
wherein the first and second switches are alternately closed and the third and fourth switches are alternately closed.

9. The wireless charger of claim 8,
wherein the first and third series connected switches are coupled to the voltage supply and
wherein the second and fourth series connected switches are coupled to a ground.

10. The wireless charger of claim 9,
wherein during the Q-factor determination phase, at least one of the second and fourth series connected switches coupled to the ground is closed.

11. The wireless charger of claim 1,
wherein the rectifier is a half-bridge rectifier.

12. The wireless charger of claim 1, further comprising:
a controller configured to,
close the switch, and
detect a presence of a foreign object (FO) within the charging area of the wireless charger based on a Q-factor calculated during the Q-factor determination phase.

13. A wireless charger, comprising:
a rectifier that receives a drive signal from a voltage supply and generates a rectified signal;
a first filter connected to the rectifier for receiving the rectified signal and generating a filtered signal, wherein the first filter includes at least one inductor;
a resonant tank circuit connected to the first filter for receiving the filtered signal and providing wireless power to a receiver located within a charging area of the wireless charger; and
a second filter connected to the first filter for bypassing the at least one inductor during a Q-factor determination phase of the wireless charger.

14. The wireless charger of claim 13,
further comprising a controller connected to the rectifier and the second filter,
wherein the rectifier comprises a full bridge circuit including a first branch having first and second series connected switches and a second branch having third and fourth series connected switches, and
wherein the first and second branches are connected in parallel with each other between the voltage supply and ground.

15. The wireless charger of claim 14,
wherein the first filter comprises a Pi-filter including the at least one inductor and an additional inductor, and wherein the second filter comprises a fifth switch connected in parallel with the at least one inductor and a sixth switch connected in parallel with the additional inductor.

16. The wireless charger of claim 15,
wherein the controller controls the first through sixth switches to place the wireless charger in one of the Q-factor determination phase and a wireless charging phase.

17. The wireless charger of claim 16,
wherein in the Q-factor determination phase, the fifth and sixth switches are closed.

18. A method for determining a quality factor of a wireless charger,
wherein the wireless charger comprises
a rectifier that receives a drive signal and generates a rectified signal,
a first filter that includes at least one inductor and configured to receive the rectified signal and generate a filtered signal, and
a resonant tank circuit that receives the filtered signal and wirelessly charges a receiver circuit located in a charging area of the wireless charger,
wherein the method comprises:
connecting a first switch across the at least one inductor of the first filter;
in a Q-factor determination phase of the wireless charger, closing the first switch; and
in a power charging phase of the wireless charger, opening the first switch.

19. The method of claim 18,
wherein the first filter is a Pi-filter including the at least one inductor and an additional inductor, and
wherein the method further comprises:
connecting a second switch across the additional inductor of the first filter;
in the Q-factor determination phase, closing the second switch; and
in the wireless charging phase, opening the second switch.

20. The method of claim 18,
wherein the rectifier is a full bridge rectifier circuit comprising
a first branch including first and second series-connected switches that are alternately closed, and
a second branch including third and fourth series-connected switches that are alternately closed,
wherein the first and second branches are connected between the power supply and ground, and
wherein the method further comprises:
during the Q-factor determination phase, closing a switch in each of the first and second branches to connect the first and second branches to ground.

21. The method of claim 18, further comprising:
connecting the rectifier as a half-bridge rectifier during the Q-factor determination phase.

* * * * *